(12) United States Patent
Singer et al.

(10) Patent No.: US 7,312,462 B2
(45) Date of Patent: Dec. 25, 2007

(54) ILLUMINATION SYSTEM HAVING A NESTED COLLECTOR FOR ANNULAR ILLUMINATION OF AN EXIT PUPIL

(75) Inventors: Wolfgang Singer, Aalen (DE); Johannes Wangler, Königsbronn (DE); Eric Sohmen, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 531 days.

(21) Appl. No.: 10/930,302

(22) Filed: Aug. 31, 2004

(65) Prior Publication Data
US 2005/0093041 A1    May 5, 2005

Related U.S. Application Data

(63) Continuation of application No. PCT/EP03/00491, filed on Jan. 20, 2003.

(30) Foreign Application Priority Data

Mar. 1, 2002    (DE)   ................................ 102 08 854

(51) Int. Cl.
*G03F 7/20*    (2006.01)
(52) U.S. Cl. .................................. 250/492.2
(58) Field of Classification Search ............. None
See application file for complete search history.

(56) References Cited

U.S. PATENT DOCUMENTS

| 5,434,901 | A |   | 7/1995  | Nagai et al. ................... 378/43 |
| 5,737,137 | A |   | 4/1998  | Cohen et al. ............... 359/859 |
| 6,007,963 | A | * | 12/1999 | Felter et al. ............. 430/271.1 |
| 6,108,397 | A |   | 8/2000  | Cash, Jr. ...................... 378/34 |
| 6,210,865 | B1 |  | 4/2001  | Sweatt et al. ................ 430/311 |
| 6,278,764 | B1 |  | 8/2001  | Barbee, Jr. et al. ........... 378/84 |
| 6,285,737 | B1 | * | 9/2001 | Sweatt et al. ................. 378/85 |
| 6,801,298 | B2 |  | 10/2004 | Goldstein .................... 355/67 |

FOREIGN PATENT DOCUMENTS

EP    1 225 481 A2    7/2002

* cited by examiner

*Primary Examiner*—Jack I. Berman
(74) *Attorney, Agent, or Firm*—Ohlandt, Greeley, Ruggiero & Perle, L.L.P.

(57) ABSTRACT

There is provided an illumination system. The illumination system includes a source for light having a wavelength ≦193 nm, a field plane, and a collector having a mirror shell for receiving a part of the light. The mirror shell is arranged so that a real image of the source is formed and comes to lie in a plane that is defocused relative to the field plane by more than 30 mm, so that the field plane is illuminated in a predetermined region, substantially homogeneously.

18 Claims, 8 Drawing Sheets

ILLUMINATION SYSTEM HAVING A NESTED COLLECTOR FOR ANNULAR ILLUMINATION OF AN EXIT PUPIL

CROSS-REFERENCE TO RELATED APPLICATIONS

The present application is a continuation of International Application No. PCT/EP03/00491, filed Jan. 20, 2003, which claims priority of German Patent Application No. 102 08 854.3, filed Mar. 1, 2002. The content of these applications is herein incorporated by reference.

BACKGROUND OF THE INVENTION

1. Field of the Invention

The invention relates to an illumination system with a light source and a field plane, comprising at least one collector with at least one mirror shell which is arranged in a rotationally symmetrical way around an axis for receiving a part of the light of a light source, so that an aperture diaphragm plane arranged in the light path after the collector is illuminated in an annular way.

2. Description of the Related Art

A projection exposure system is known from U.S. Pat. No. 5,737,137 which comprises a laser plasma source as a light source. The illumination system of the projection exposure system according to U.S. Pat. No. 5,737,137 is arranged in such a way that an exit pupil of the illumination system is illuminated in a circular (i.e. annular) fashion. In order to achieve this, the illumination system comprises an arrangement of three mirrors, with two mirrors forming an inverse Cassegrain or Schwarzschild system with a 25% obscuration. The mirrors of the Schwarzschild system are normal-incidence mirrors with a multi-layer system on which the light rays impinge under angles $\alpha < 30°$.

The projective objective of the projection exposure system as known from U.S. Pat. No. 5,737,137 comprises two mirrors with an aperture through which the light passes through.

Moreover, the system according to U.S. Pat. No. 5,737,137 is a system with critical illumination.

The disadvantageous aspect in the system according to U.S. Pat. No. 5,737,137 is that only normal-incidence mirrors are used in the illumination system directly downstream of the source. Although the entry of debris into the projection objective system can be prevented according to U.S. Pat. No. 5,737,137, the normal-incidence mirrors of the illumination system will degrade very rapidly by the debris of the source. As a result of degradation of the multi-layer system, normal-incidence mirrors lose reflectivity to a very high extent over time.

A further disadvantage of the system according to U.S. Pat. No. 5,737,137 is that for a homogeneous illumination of the field plane at critical illumination with a small source it is necessary to have a very large lateral magnification. In the case of very large magnifications however, the dimension especially of the first mirror will become very large and thus difficult to produce with an inverse Cassegrain or Schwarzschild system.

SUMMARY OF THE INVENTION

It is the object of the present invention to provide an illumination system which provides an annular illumination in an aperture diaphragm plane or a plane conjugated thereto. The exit pupil of the illumination system which coincides with the entrance pupil of the downstream projection objective is then also illuminated in an annular way. The disadvantages of the illumination system as known from U.S. Pat. No. 5,737,137 are to be avoided. Moreover, a homogeneous illumination in a field plane is to be enabled with the illumination system in accordance with the invention.

This is achieved in such a way that an illumination system comprises a collector with at least one mirror shell which is rotationally symmetrical around an axis.

In a respective configuration of the mirror shells, such a collector projects a light source situated in front of the collector into a real light source image. The real light source image is also known as secondary light source.

In accordance with the invention, a homogeneous illumination of a field plane can be achieved in two ways. According to a first embodiment of the invention the mirror shells are dimensioned in such a way that a strongly enlarged image of the light source is projected with a lateral magnification of $\beta > 5$ close to the field plane.

According to a second embodiment of the invention, the mirror shells are dimensioned in such a way that the field plane is defocused relative to the light source image, leading to a homogeneous illumination in a predetermined region in the field plane. The illumination is no longer critical in this case. The position of the homogeneously illuminated field plane which is defocused relative to the position of the light source image, is defined namely through the point of intersection of a first inner marginal ray of a first light bundle and a second inner marginal ray of a second light bundle or through the point of intersection of a first outer marginal ray of a light bundles and a second outer marginal ray of a light bundles. The first and second light bundles are determined by the extended light source and the aperture ray. A collector shell receives rays in a specific annular aperture from the light source. A first middle aperture ray is determined between the inner aperture ray and the outer aperture ray of the annular aperture under which a ray from the light source defines a first point of intersection with the collector shell. The middle aperture beam between light source and collector shell, which aperture beam is reflected relative to the axis of rotation of the collector shell on which or close to which the light source is situated, defines a second middle aperture beam and a second point of intersection. A first and second point of intersection lie together with the optical axis and thus in a meridional plane. The first light bundle is the light bundle which is received in the first point of intersection by the collector shell from the extended light source. The second light bundle is the light bundle which is received in a second point of intersection by the collector shell from the extended light source.

Preferably, a structural mask is placed in the field plane or a plane conjugated thereto, which mask is projected onto a light-sensitive object by means of a projection objective.

The relevant aspect for the collector in accordance with the invention, which comprises mirror shells which are rotationally symmetrical about an axis, is that the received rays are received under an angle of $>70°$ relative to the normal of the surface, i.e. the collector is a so-called grazing-incidence collector.

Grazing-incidence collectors have the advantage as compared with normal-incidence collectors that they will degrade only to a low extent by the debris of the source, i.e. they hardly lose reflectivity. Moreover, grazing-incidence mirrors are always arranged in a simpler way because as a rule they only have one optical coating which is preferably made of ruthenium, rhodium or gold. Moreover, reflectivity >80% can be achieved at lower requirements placed on the surface roughness.

In an advantageous embodiment of the invention the collector not only comprises a single rotationally-symmetrical mirror shell, but also a plurality of such rotationally-symmetrical mirror shells, with the mirror shells being arranged within each other about a common rotational axis.

Preferably, the mirror shells are arranged in such a way that the annular illumination of each mirror shell in the aperture diaphragm plane for adjacent mirror shells are continually adjacent to each other. In a preferred embodiment, the middle aperture ray is then defined by the middle ray between an outer marginal ray between one point of the light source and the outermost shell and an inner marginal ray between the point of the light source and the innermost shell. In a further embodiment, a middle aperture ray is defined for every single collector shell, so that for each collector shell a homogeneous illumination is achieved independently in the same homogeneously illuminated field plane. In this case the images of the light source of the individual collector shells do not lie necessarily in the same plane.

Collectors with two reflections are especially preferable. Collectors with two reflections can be configured as nested Wolter systems with first mirror shells which are annular sections of hyperboloids and second mirror shells which are annular sections of ellipsoids. Wolter systems are known from literature, e.g. from Wolter, "Annalen der Physik" 10 (Annals of Physics), p. 94 to 114, 1952. Reference is hereby made to J. Optics, Vol. 15, 270 to 280, 1984, concerning Wolter systems with a real intermediate image of the source which is formed by the combination of a hyperboloid surface with an ellipsoid surface.

An especial advantage of Wolter systems is that in a Wolter system with two reflections with incident angles of >70° relative to the normal of the surface it is possible to achieve a maximum collection aperture of $NA_{max}=0.985$ according to an aperture angle of 80°. In this embodiment, one is still in the highly reflective range of reflection under grazing incidence with a reflectivity of >70%.

It is especially preferable when the illumination system between collector and exit pupil comprises at least two optical elements with positive refractive power. In this way it possible to ensure that the field plane which is situated in the light path starting with the light source after the aperture diaphragm plane is projected into a conjugated plane to the field plane which comes to lie before the exit pupil of the illumination system. The aperture diaphragm plane is a plane which is conjugated relative to the exit pupil of the illumination system. In the plane which is conjugated to the field plane, the structured mask to be illuminated (and in particular the reticle) can be arranged in a projection exposure system.

In order to have the lowest possible light losses in the system, the two optical elements with positive refractive power are operated under angles of >70° or <20° relative to the normal of the surface. A further advantage is that in this case the illumination of the reticle occurs in a non-polarized manner.

An annular illumination in the exit pupil with $\sigma_{out} \geq 0.55$ is achieved with the illumination system in accordance with the invention. In this respect, $\sigma_{out}$ is given by the quotient of the sine of the angle to the optical axis of the outer marginal ray of the annular illumination and the objective aperture. Parallel thereto it is possible to define a $\sigma_{in\text{-}volume}$ via the inner marginal ray of the annular illumination, for which values of $\sigma_{in} < 0.35$ can be achieved.

In order to guide the light below the reticle arranged in the field plane, at least one deflection or deviation mirror is provided advantageously as a third optical element in the light path between the first and second optical element. This mirror can preferably be a planar mirror.

In order to enable the operation of the reticle in reflection, the reticle is not arranged precisely perpendicular to the optical axis. Instead, the reticle is positioned inclined to an axis being perpendicular to the optical axis, with the angle of inclination being approximately 3° with respect to the conjugated field plane.

In addition to the illumination system, the invention also provides a projection exposure system which is characterized in that the illumination system comprises at least one collector which comprises a mirror shell which is arranged in a rotationally symmetrical way around an axis and reflects light in grazing incidence, i.e. with angles >70° relative to the normal of the surface, as well as a projection objective which can be arranged as a Schwarzschild system.

BRIEF DESCRIPTION OF THE DRAWINGS

The invention is to be described below by way of example by reference to the embodiments shown in the drawings, wherein.

DESCRIPTION OF THE INVENTION

Figure 1:
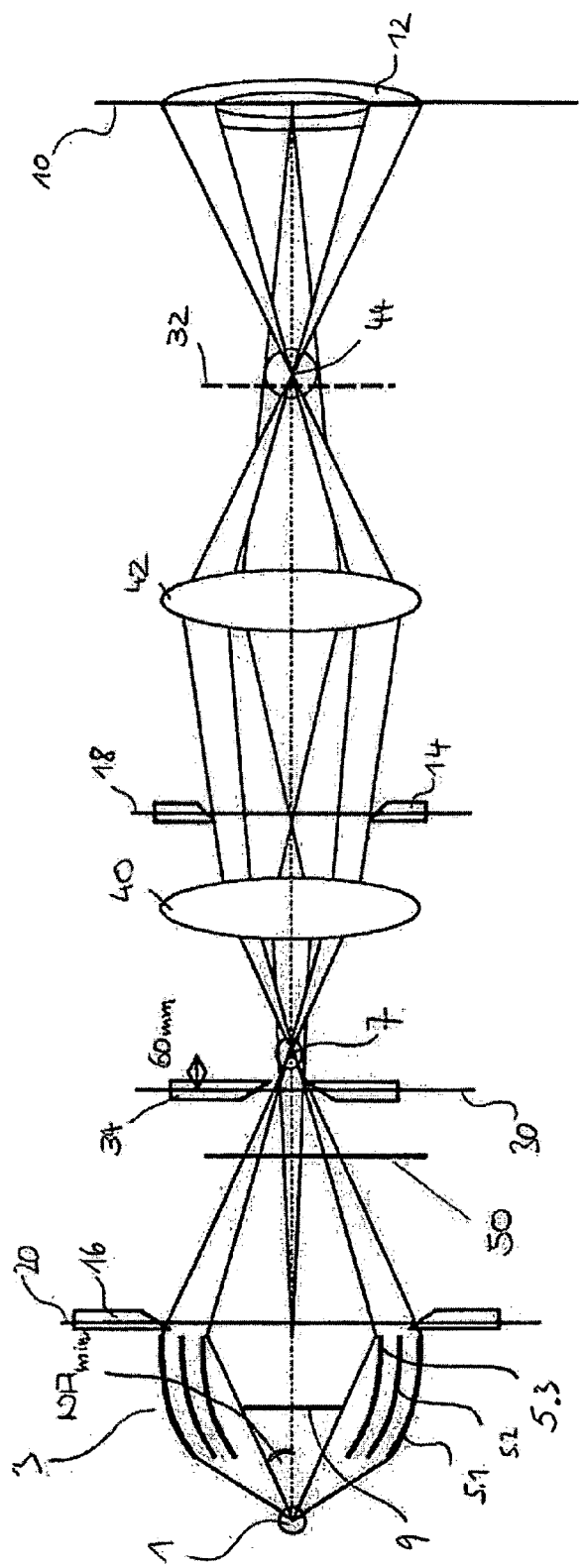
FIG. 1 shows the general configuration of an illumination system in accordance with the invention.

FIG. 1 shows an illumination system in accordance with the invention in an exemplary refractive illustration. The illumination system in accordance with the invention comprises a light source 1. The light source 1 is preferably a plasma source such as a dense-plasma-focus source or a hollow-cathode source. The light of the light source 1 is received by the collector 3. The schematically illustrated collector 3 comprises in the illustrated embodiment a total of three mirror shells 5.1, 5.2 and 5.3 which are arranged within each other and which receive the light of the light source 1 under grazing incidence and project an image 7 of the light source. Nested, reflective collectors such as collector 3 necessary comprise a central obscuration, below a certain aperture angle $NA_{min}$ the radiation of the source can no longer be received. This radiation is therefore blocked off with a diaphragm so that it cannot reach the subsequent illumination system. The diaphragm is designated in FIG. 1 with reference numeral 9.

The first aperture diaphragm plane 20 which is situated in the light path downstream of the collector 3 is situated conjugated to the exit pupil 10 of the illumination system. The collector shells 5.1, 5.2, 5.3 of the collector 3 are chosen in such a way that in conjunction with the downstream optical elements in the exit pupil 10 of the illumination system, a predetermined aperture 12 is illuminated in an annular fashion. The predetermined aperture 12 in the exit pupil 10 is delimited by the aperture diaphragms 16 in the first aperture diaphragm plane. Since a further plane 18 which is conjugated to the aperture diaphragm plane 20 is formed in the system, an alternative or second aperture diaphragm 14 can be provided. The second aperture diaphragm 14 in plane 18 has the advantage that it can be chosen in this position having a smaller dimension.

As a result of the non-received aperture of the source radiation below the minimal aperture angle $NA_{min}$, the desired annular illumination is obtained in a mandatory manner in the aperture diaphragm plane 20 and in the plane conjugated thereto in which the exit pupil 10 comes to lie.

Figure 5:
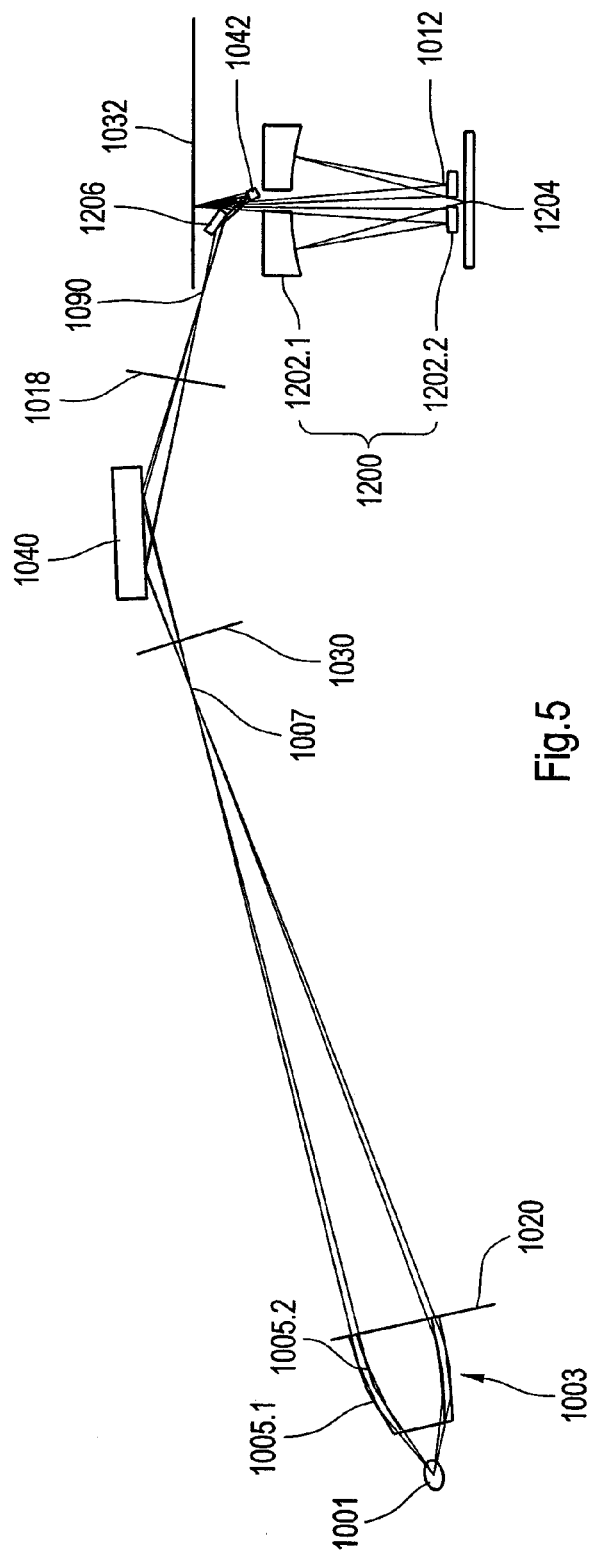
FIG. 5 shows an illumination system with three optical elements.

In order to obtain the predetermined homogeneous illumination in the field plane, the light source 1 is not projected exactly into the field plane, but is slightly defocused. In the present case the defocusing between the image 7 of the light source and that of the field plane 30 is approximately 60 mm. A field diaphragm 34 can be arranged in the field plane 30. The structured mask, the so-called reticle is arranged in the field plane 32 which is conjugated to the field plane 30. The reticle is projected onto a light-sensitive object by means of a projection objective which is shown in FIG. 5 by way of an example. The field diaphragm 34 delimits the ray bundle to the desired field size of 3 mm×3 mm for example on the structure-bearing mask, blocks the further radiation and thus advantageously reduces the thermal load on the subsequent optical elements.

It is ensured by the defocusing of the image 7 of the light source relative to the field plane that the deviations in homogeneity of the illumination in the field to be illuminated of approximately 3 mm×3 mm is less than ±5% in the field plane 32.

In the arrangement as shown in FIG. 1, the illumination system comprises a condenser lens system with two optical elements 40, 42 with positive optical refractive power in order to exchange the sequence of the aperture diaphragm plane 20 which coincides with the end of the nested collector 3 and the field plane 30 which is situated close to the intermediate image 7 of the source. The optical elements 40, 42 are shown schematically as refractive components. A possibility to derive reflective components is obvious to the person skilled in the art. The field plane in which the reticle is arranged is the field plane 32 which is conjugated to the field plane 30 and which is formed according to the system from the first optical element 40 and the second optical element 42 and is situated in front of the exit pupil 10. An image 44 of the light source image 7, namely a so-called tertiary light source, is formed by the two optical elements 40, 42.

In FIG. 1, the illumination system further preferably comprises a spectral filter 50 in order to filter the light of the light source 1 and to provide after the filter 50 radiation in the wavelength that is solely required, e.g. a wavelength of 13.5 nm. The spectral filter can be a zirconium foil or a grating spectral filter.

FIG. 2 shows again how a homogeneous illumination can be achieved in the field planes 30.1, 30.2 according to the invention by an enlarged source and slight defocusing of the field plane 30.1 or the alternative field plane 30.2 to the image of the light source 7. The primary light source 1 is in the present case an extended light source. A first point on the mirror shell 5.2 of the nested collector which is given by the first point of intersection S1 of a first middle aperture ray 102.1 with the collector shell 5.2 of the collector in the meridional plane receives a first ray bundle 102.2 of the light source 1. The extension of the ray bundle is given by the extension of the light source 1. An image 7 of the light source 1 is formed by the reflection under grazing incidence, i.e. under an angle of >70° relative to the normal of the surface of the mirror shell 5.2. The size of the formed light source image is defined by the reflected marginal rays 104.1 and 105.1 and the distance to the first point of intersection S1. A plane is understood in this application as being a meridional plane which comprises the axis of rotation HA.

In the meridional plane mirrored relative to the optical axis HA there is a second middle aperture ray 102.3 and a second point of intersection S2 with the collector shell 5.2 opposite of the first middle aperture ray 102.1 and the first point of intersection S1. A second luminous beam 102.4 of the light source 1 is received in the second point of intersection S2 of the collector with the mirror shell 5.2. The second outer marginal ray 104.2 and the second inner marginal ray 105.2 of the second ray bundle 102.4 are determined again by the maximum extension of the light source 1. The inner marginal rays 105.1, 105.2 of the first ray bundle 102.2 and the second ray bundle 102.4 intersect in a point of intersection 107.2 behind the image 7 of the light source 1 in a plane 30.2. The outer marginal rays 104.1, 104.2 of the first ray bundle 102.2 and the second ray bundle 102.4 intersect before the image 7 of the light source 1 in a point of intersection 107.1 in a plane 30.1.

Figure 4:
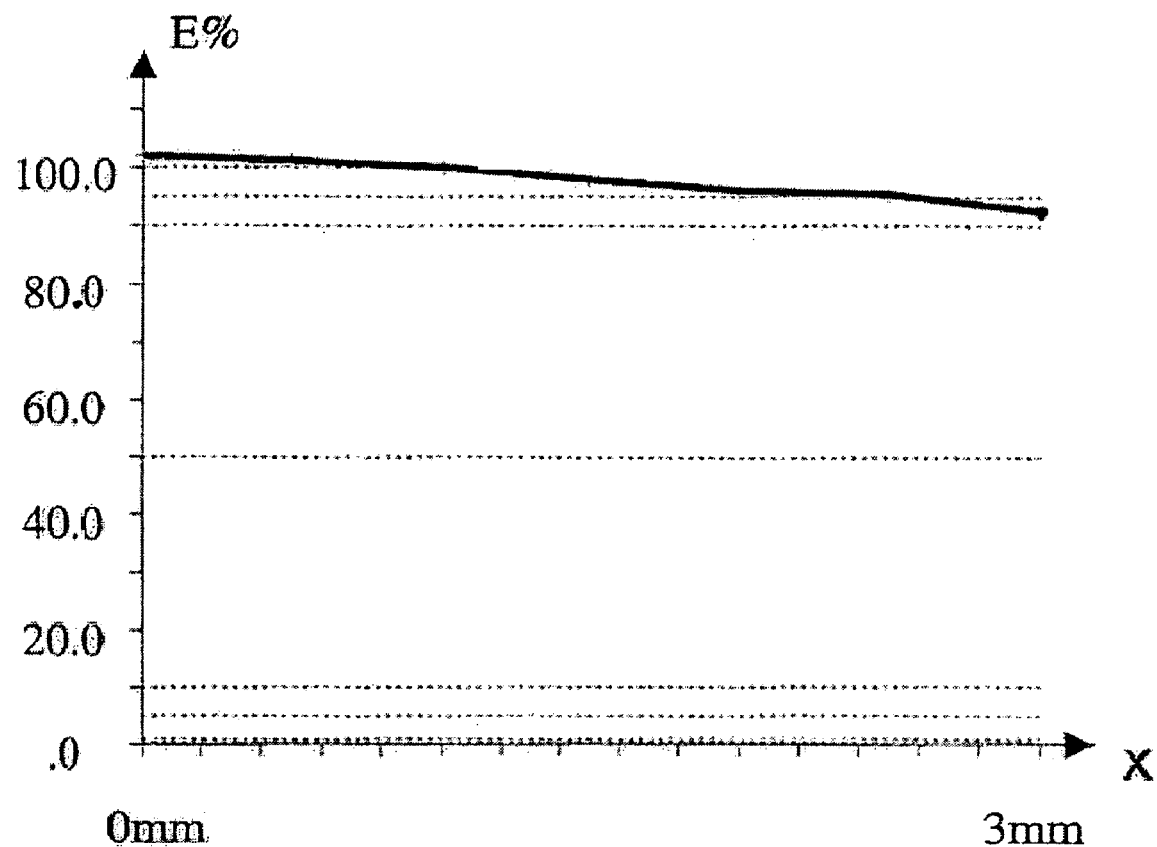
FIG. 4 shows the energy distribution in the field plane in a system according to FIG. 2.

A substantially homogeneous illumination (as shown in FIG. 4) is obtained along the X-direction in or close to the planes 30.1, 30.2. One of the planes 30.1, 30.2 can then be chosen as the field plane of the system.

Figure 2:
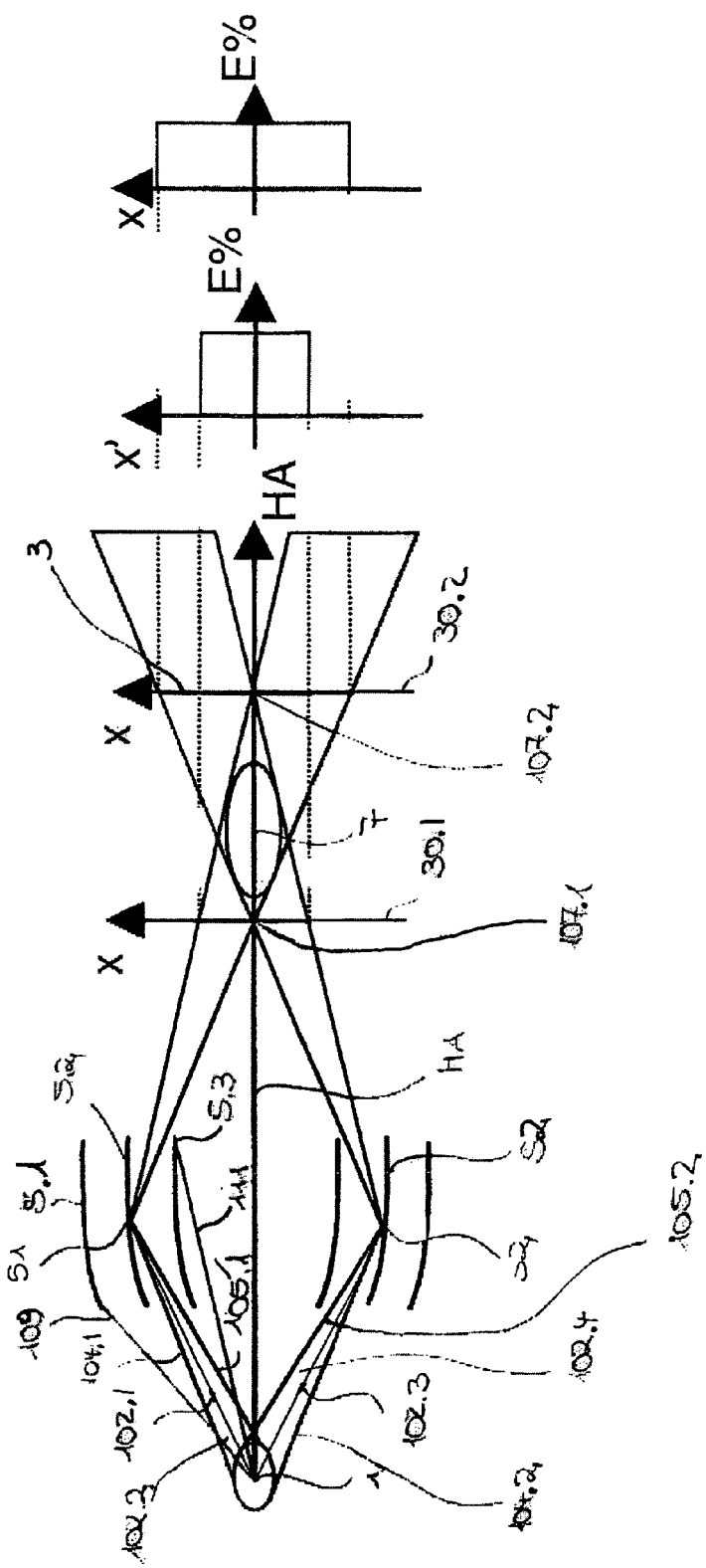
FIG. 2 shows the establishment of the homogeneous illumination in the field plane in the case of defocused arrangement in relation to the light source.

Whereas it was shown in FIG. 2 for a single mirror shell of a nested collector that a homogeneous illumination can be achieved in planes 30.1, 30.2 in a defocused manner relative to the secondary light source 7, it is also possible in systems with more than one shell to achieve a homogeneous illumination in the planes 30.1, 30.2. There is no change in the derivation with respect to the embodiment described in FIG. 1 with the exception of the choice of the middle aperture ray. The middle aperture ray 102.1 is defined in the embodiment shown in FIG. 2 as the middle ray between an outer marginal ray 109 between a point of the light source and the outermost shell 5.1 and an inner marginal ray 111 between the point of the light source and the innermost shell 5.3.

Figure 3:
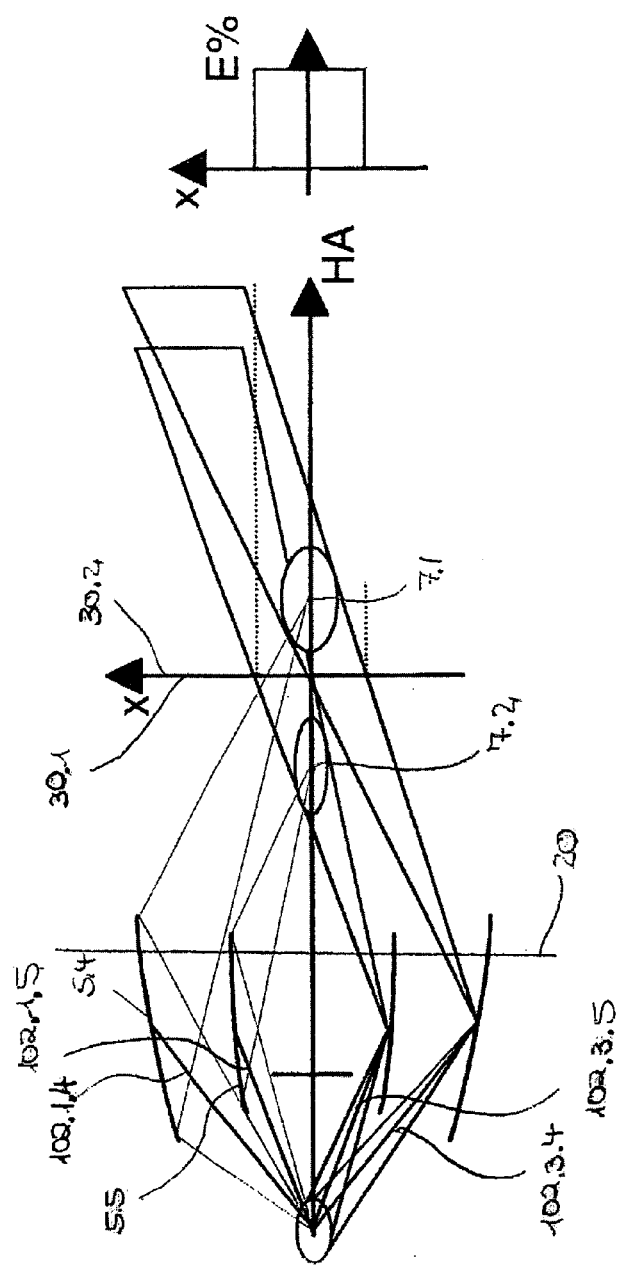
FIG. 3 show the establishment of the homogeneous illumination in the field plane in the case of defocused arrangement in relation to the light source with different defocusing for different collector shells.

As is shown in FIG. 3, it is possible to choose for different collector shells different position of the planes 30.1 and 30.2 associated to each collector shell. For example, for the outermost shell 5.4, the plane 30.1 is situated before the intermediate image 7.1 of the outer most shell 5.4, and for the inner shell 5.5, the plane 30.2 is situated downstream of the intermediate image 7.2 of the inner shell 5.5. Through a suitable choice of the shell parameters it is possible to displace the planes associated with the respective shells in such a way that the planes 30.1 and 30.2 will coincide. An even better mixing of light and a further improvement in the homogeneity in the field plane 30.1 and 30.2 to be illuminated is achieved in this manner. The shell parameters can be chosen in such a way that an annular illumination is obtained in the plane 20 in or behind the collector. The middle first aperture ray of the outermost shell 5.4 is designated with reference numeral 102.1.4 and the middle second aperture ray of the outermost shell 5.4 is designated with reference numeral 102.3.4, the middle first aperture ray of the innermost shell 5.5 is designated with 102.1.5 and the middle second aperture ray of the innermost shell 5.5 is designated with 102.3.5.

FIG. 5 shows a system according to the invention in a reflective illustration. The system shown in FIG. 5 comprises, in addition to the illumination system, the projection lens system which is situated downstream of the illumination system. The same components as in FIG. 1 are denoted with reference numbers higher by 1000. The light of the light source 1001 is received by the nested collector 1003 with two shells 1005.1, 1005.2. An image of the light source 1001, the so-called secondary light source 1007, is provided. Field plane and aperture diaphragm plane 1020 are exchanged in their sequence in the light path with the help of the grazing-incidence mirror 1040 and the normal-incidence mirror 1042 which correspond to the first and second optical element. The conjugated field plane 1032 in which a structured mask is illuminated in a homogeneous way according to the invention is arranged in a defocused manner relative to the image of the secondary light source 1007, the so-called tertiary light source. This defocusing can clearly be seen in FIG. 5 because the tertiary light source image 1090 comes to lie already behind the aperture diaphragm 1018.

The exit pupil 1012 of the illumination system coincides with the entrance pupil of the projective objective 1200 which is arranged as a Schwarzschild system. The projection objective 1200 comprises two mirrors 1202.1 and 1202.2. The light-sensitive object onto which the mask is projected is situated in the plane 1204. In order to hold the beam path below the reticle situated in the conjugated field plane 1032, a third optical element 1206 is provided in the present system which deflects the beam from the first optical element 1040 to the second optical element 1042. In order to keep the reflection losses at a minimum, the rays impinge on the first optical element 1040 under an angle >70° relative to the normal of the surface and on the normal-incidence mirror 1042 with angles <20° relative to the normal of the surface. A further advantage of this angle of incidence is the substantial independence of reflectivity from the polarization of the incident light, so that there is a non-polarized illumination on the reticle.

Figure 6:
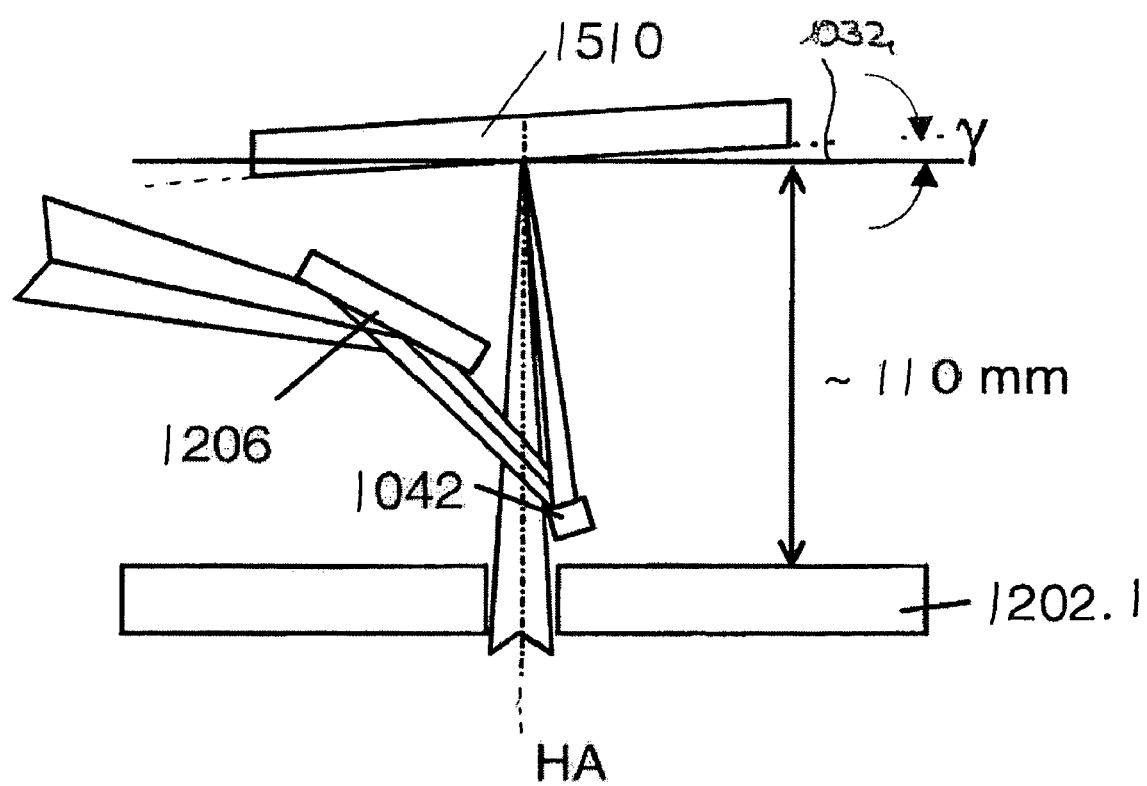
FIG. 6 shows the inclined reticle.

FIG. 6 shows in more detail again the third optical element 1206 and the second optical element 1042. The arrangement of the first mirror 1202.1 of the objective 1200 which is centered relative to the optical axis HA of the objective 1200 can clearly be seen. Since in EUV lithography it is necessary to operate the reticle in reflection on the one hand and since the optical elements of the present Schwarzschild objective are arranged in a centered manner relative to the optical axis HA, the reticle is inclined by at least the aperture angle (which in the present case is 3.44°) relative to the field plane. The angle of inclination γ of the reticle 1510 relative to the field plane 1032 is thus in the present example γ>3.5°.

Figure 7:
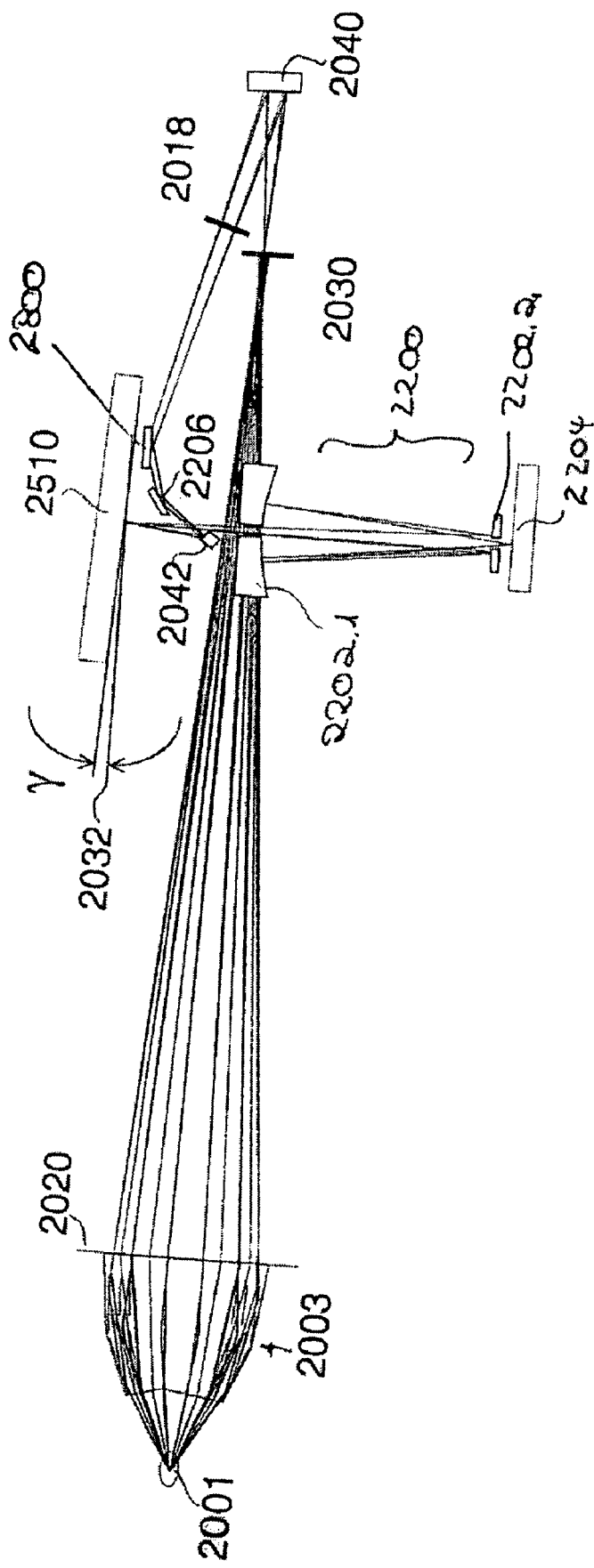
FIG. 7 shows a folded system with a total of four optical elements.

FIG. 7 shows an alternative system according to Tables 1 and 2 in which the beam path is additionally folded from the light source to the field plane for the purpose of shortening the overall length of the system. In addition, a second planar mirror 2800 is introduced in the beam path so that the illumination system is completely situated below the reticle plane. The same components as in the preceding figures are designated with the same reference numerals increased by 1000 relative to FIG. 4. Therefore 2001 designates the light source, 2003 the nested collector consisting of three shells, 2020 the first aperture diaphragm plane, 2030 the conjugated field plane, 2040 the first optical element, 2042 the second optical element, 2200 the projective objective with two mirrors 2202.1 and 2202.2, and 2510 the reticle which is inclined relative to the field plane 2032, and 2204 the plane in which the light-sensitive object is arranged. Preferably, the tilting angle of the first optical element 2040 is chosen in such a way that the beam path between light source 2001 and the first optical element 2040 is not situated in the same plane as the beam path of the subsequent optical elements, as also the reticle 2510 and the light-sensitive object in plane 2204. In FIG. 7, the ray bundle is thus delimited in the field plane 2030 to such an extent that the reticle 2510 is now only illuminated within an area on a surface of 3 mm×3 mm.

Table 1: Parameters of the optical elements in the beam path after the collector 2003

TABLE 1

Parameters of the optical elements in the beam path after the collector 2003

| Plane | Radius | Distance to next mirror | Angle of incidence of the principal ray relative to the normal of the surface |
|---|---|---|---|
| 2020 | Diaphragm plane | 1285 mm | 0° |
| 2030 | Field plane | 209.2 mm | 0° |
| 2040 | −330.5 mm | 185.8 mm | 7.25° |
| 2018 | Diaphragm plane | 290 mm | 0° |
| 2800 | Planar | 70 mm | 75° |
| 2206 | Planar | 70 mm | 72° |
| 2042 | −497.2 mm | 100 mm | −16° |
| 2032 | Reticle plane | | |

TABLE 2

Optical data of the collector 2003

| Shell | | K | ZS [mm] | ZV [mm] | ZH [mm] |
|---|---|---|---|---|---|
| | Hyperboloid R [mm] | | | | |
| 1 | 3.5076 | −1.0399 | −1.74 | 107.56 | 182.35 |
| 2 | 5.0414 | −1.0571 | −2.49 | 105.05 | 179.53 |
| 3 | 7.2534 | −1.0814 | −3.56 | 102.83 | 177.68 |
| | Ellipsoid R [mm] | | | | |
| 1 | 4.6059 | −0.9945 | −181.56 | 363.50 | 454.10 |
| 2 | 6.4739 | −0.9923 | −184.74 | 364.03 | 457.33 |
| 3 | 9.0813 | −0.9893 | −189.80 | 366.19 | 463.15 |

Figure 8:
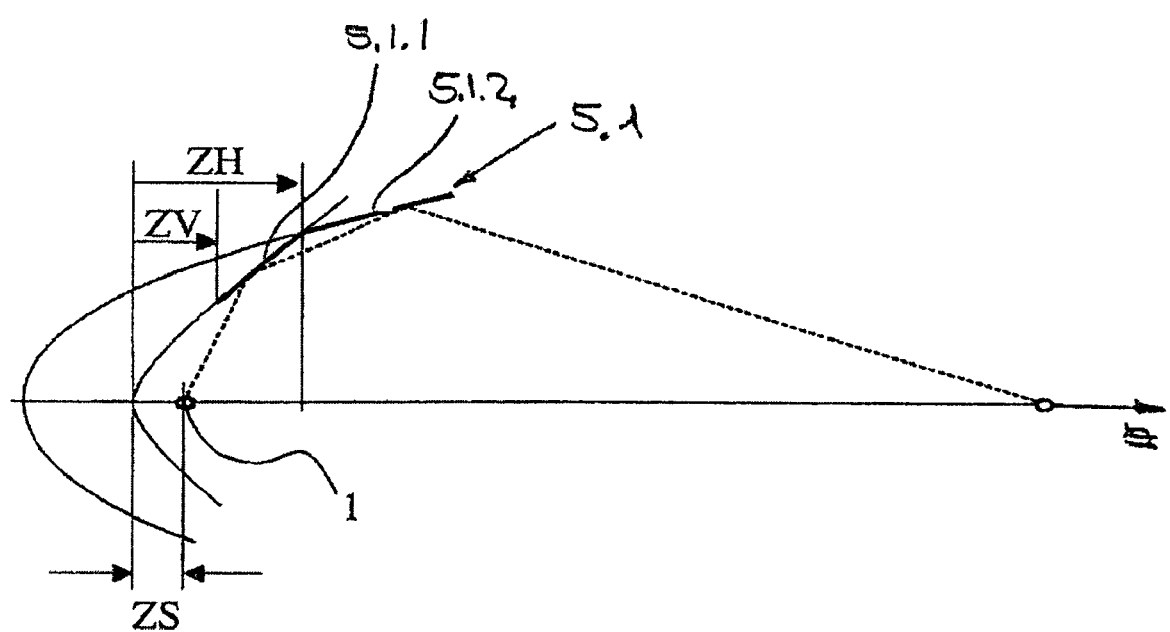
FIG. 8 shows an explanatory diagram for the coordinates of the nested collector.

In FIG. 8 and Table 2, the characteristic data of a Wolter system comprising two segments each, a first hyperboloid segment and a second ellipsoid segment, are shown per mirror shell in an exemplary way for the three mirror shells 5.1, 5.2, 5.3 of the nested collector of FIG. 7. Reference numeral 5.1.1 designates the first annular segment for the first mirror shell 5.1 and 5.1.2 the second annular segment. ZS designates the z position of the surface apex relative to the position of the light source 1, ZV and ZH designate the starting and end position of the first segment 5.1.1 which is a hyperboloid, relating to the position of the surface apex ZS. The reference numerals ZS, ZH and ZV are used in an analogous way for the second segment 5.1.2 of the mirror shell 5.1 which is an ellipsoid.

The design data of the collector according to FIG. 8 are obtained with the radius of curvature R and the conical constant K of the respective mirror segment and the definitions given above as in Table 2.

A system is provided for the first time with the present invention in which a homogeneous illumination in a field plane is achieved and the light losses are minimized.

The invention claimed is:

1. An illumination system comprising:
   a source for light having a wavelength $\leq 193$ nm;
   a field plane; and
   a collector having a mirror shell for receiving a part of said light,
   wherein said mirror shell is arranged so that a real image of said source is formed and comes to lie in a plane that is defocused relative to said field plane by more than 30 mm, so that said field plane is illuminated in a predetermined region, substantially homogeneously.

2. The illumination system of claim 1,
   wherein said mirror shell is rotationally symmetric around an axis, and
   wherein said illumination system further comprises an aperture diaphragm plane illuminated in an annular manner.

3. The illumination system of claim 2,
   wherein said collector receives an aperture bundle from said source and has an axis of rotation on which or close to which said source is situated,
   wherein said aperture bundle includes a first middle aperture ray;
   wherein said first middle aperture ray is reflected on said axis of rotation and defines as second middle aperture ray,
   wherein said first middle aperture ray intersects said mirror shell at a first point of intersection and said second middle aperture ray intersects said mirror shell at a second point of intersection so that a first ray bundle and a second ray bundle that start from said light source are received by said first and second points of intersection,
   wherein said first ray bundle includes a first inner marginal ray and a first outer marginal ray,
   wherein said second ray bundle includes a second inner marginal ray and a second outer marginal ray, and
   wherein said field plane is situated virtually perpendicular to said axis of rotation and close to a point of intersection of said first inner marginal ray and said second inner marginal ray or close to a point of intersection of said first outer marginal ray and said second outer marginal ray and defocused to said plane in which said image of said source is formed.

4. The illumination system of claim 1, wherein said collector comprises a plurality of rotational symmetrical mirror shells arranged within each other about a common axis.

5. The illumination system of claim 4, wherein each of said plurality of mirror shell is assigned an annular light distribution in an aperture diaphragm plane, and an annular light distribution of adjacent mirror shells in said aperture diaphragm plane follows virtually continuously one after the other.

6. The illumination system of claim 1, wherein said mirror shell comprises a first segment having a first optical surface and a second segment having a second optical surface.

7. The illumination system of claim 6, wherein said first segment is a section of a hyperboloid and said second segment is a section of an ellipsoid.

8. The illumination system of claim 1, further comprising a first optical element and a second optical element.

9. The illumination system of claim 8, wherein said first optical element is a grazing-incidence mirror on which rays impinge at angles of $\alpha > 70°$ relative to a normal of a surface of said first optical element.

10. The illumination system of claim 8, wherein said first optical element is a normal-incidence mirror on which the rays impinge at angles of $\alpha \leq 30°$ relative to a normal of a surface of said first optical element.

11. The illumination system of claim 8, wherein said second optical element is a normal-incidence mirror on which rays impinge at angles of $\alpha \leq 20°$ relative to a normal of a surface of said second optical element.

12. The illumination system of claim 8, further comprising a third optical element for guiding said light from said first optical element to said second optical element.

13. The illumination system of claim 12, wherein said third optical element is a plane mirror.

14. A projection exposure system for microlithography, comprising:
    the illumination system of claim 1 for illuminating a mask; and
    a projection objective for projecting the mask onto a light-sensitive object.

15. The projection exposure system of claim 14, wherein said project objective is a Schwarzschild system.

16. A projection exposure system for microlithography, comprising:
    an illumination system for illuminating a mask, wherein said illumination system includes a collector having a mirror shell that is rotationally symmetrical about an axis, and on which light impinges with grazing incidence at an angle of greater than 70° relative to a normal of a surface of said mirror shell; and
    a projection objective for projecting the mask onto a light-sensitive object, wherein said projection objective is a Schwarzschild system.

17. The projection exposure system of claim 16, wherein said mask is arranged in a field plane of said illumination system or in a plane conjugated to said field plane.

18. A method for producing microelectronic components, comprising employing the projection exposure system of claim 16.

* * * * *